United States Patent
Hayashi et al.

(10) Patent No.: US 10,204,768 B2
(45) Date of Patent: Feb. 12, 2019

(54) ETCHING DEVICE, PLASMA PROCESSING DEVICE

(75) Inventors: Yasuyuki Hayashi, Hyogo (JP); Kenichi Tomisaka, Hyogo (JP)

(73) Assignee: SPP TECHNOLOGIES CO., LTD., Tokyo (JP)

( * ) Notice: Subject to any disclaimer, the term of this patent is extended or adjusted under 35 U.S.C. 154(b) by 884 days.

(21) Appl. No.: 13/578,739

(22) PCT Filed: Nov. 25, 2010

(86) PCT No.: PCT/JP2010/070977
§ 371 (c)(1), (2), (4) Date: Aug. 13, 2012

(87) PCT Pub. No.: WO2011/104958
PCT Pub. Date: Sep. 1, 2011

(65) Prior Publication Data
US 2012/0305194 A1 Dec. 6, 2012

(30) Foreign Application Priority Data
Feb. 25, 2010 (JP) .................. 2010-039608

(51) Int. Cl.
*B05C 13/02* (2006.01)
*H01J 37/32* (2006.01)

(52) U.S. Cl.
CPC ...... *H01J 37/32623* (2013.01); *H01J 37/321* (2013.01)

(58) Field of Classification Search
USPC ............... 118/720, 724–732; 156/345.3, 156/345.51–345.55
See application file for complete search history.

(56) References Cited

U.S. PATENT DOCUMENTS 5,851,299 A * 12/1998 Cheng et al. .................. 118/729
6,051,122 A *  4/2000 Flanigan .................. 204/298.11
(Continued)

FOREIGN PATENT DOCUMENTS

JP       7-221024 A    8/1995
JP    2004119760 A    4/2004
(Continued)

OTHER PUBLICATIONS

International Search Report for related international application No. PCT/JP2010/070977, report dated Jan. 31, 2011.

*Primary Examiner* — Parviz Hassanzadeh
*Assistant Examiner* — Tiffany Z Nuckols
(74) *Attorney, Agent, or Firm* — Miller, Matthias & Hull LLP

(57) ABSTRACT

A plasma processing device capable of positioning a protective member for covering the upper surface of a peripheral edge portion of a substrate, with high accuracy. A plasma processing device has, a platen on which a substrate K is placed, a gas supply device, a plasma generating device, an RF power supply unit, an annular and plate-shaped protective member configured to be capable of being placed on a peripheral portion of the platen and which covers a peripheral edge portion of the substrate K, support members supporting the protective member, and a lifting cylinder lifting up and down the platen. At least three first protrusions which are engaged with the peripheral portion of the platen are formed on a pitch circle on the lower surface of the protective member and the center of the pitch circle is co-axial with the central axis of the protective member.

11 Claims, 12 Drawing Sheets

(56) References Cited

U.S. PATENT DOCUMENTS

| | | | | |
|---|---|---|---|---|
| 6,168,668 | B1* | 1/2001 | Yudovsky | H01L 21/68 |
| | | | | 118/715 |
| 6,797,068 | B1* | 9/2004 | Yamasaki et al. | 118/728 |
| 2004/0242012 | A1* | 12/2004 | Ikeda | 438/720 |
| 2009/0200251 | A1* | 8/2009 | Shimizu | C23C 16/45544 |
| | | | | 211/41.18 |
| 2011/0051115 | A1* | 3/2011 | Shimane | C23C 14/042 |
| | | | | 355/73 |
| 2011/0159211 | A1* | 6/2011 | Du Bois et al. | 427/569 |

FOREIGN PATENT DOCUMENTS

| | | |
|---|---|---|
| JP | 2004-200219 A | 7/2004 |
| JP | 2004-214351 A | 7/2004 |
| JP | 2007-150036 A | 6/2007 |

* cited by examiner

ETCHING DEVICE, PLASMA PROCESSING DEVICE

CROSS-REFERENCE TO RELATED APPLICATIONS

This application is a U.S. National Stage filing under 35 USC § 371 of International Patent Application No. PCT/JP2010/070977 filed on Nov. 25, 2010, which claims priority under the Paris Convention to Japanese Application No. 2010-039608,filed on Feb. 25, 2010.

FIELD OF THE DISCLOSURE

The present invention relates to an etching device and a plasma processing device, in which a predetermined processing gas is supplied into a processing chamber and plasma is generated therefrom and a substrate in the processing chamber is processed by the generated plasma.

BACKGROUND OF THE DISCLOSURE

As an example of plasma processing, there is etching processing. Etching processing is performed by placing a substrate to be etched on a platen arranged in a processing chamber, supplying an etching gas into the processing chamber and generating plasma therefrom, and applying a bias potential to the platen.

By the way, the substrate to be etched includes a substrate having no resist film formed on the upper surface of a peripheral portion thereof, and in such a case, the portion where no resist film is formed of the upper surface of the peripheral portion of the substrate is etched. Accordingly, conventionally, as a device capable of preventing such a disadvantage, there is a jig for plasma etching 100 as shown in FIGS. 8 and 9, for example (see the Japanese Unexamined Patent Application Publication No. 2007-150036).

As shown in FIGS. 8 and 9, the jig for plasma etching 100 is made of a ring-shaped member and is formed to have an inner diameter larger than the outer diameter of a substrate K, and has a containing portion 101 within the ring of which the substrate K is contained, a contact portion 102 which is formed inside the containing portion 101 and is capable of being brought into contact with the upper surface of a peripheral edge portion of the substrate K, and an extending portion 103 which is formed to extend inward from the contact portion 102 and is provided at a position higher than the upper surface of the substrate K at a distance therefrom.

According to this jig for plasma etching 100, when the substrate K is etched, the jig 100 is arranged so that the contact portion 102 is brought into contact with the upper surface of the peripheral edge portion of the substrate K, thereby covering the upper surface of a peripheral portion of the substrate K with the extending portion 103 and the contact portion 102. Therefore, on the upper surface of the peripheral portion of the substrate K, ion incidence caused by a bias potential applied to a platen 105 is prevented and etching is therefore prevented.

However, when this jig for plasma etching 100 is arranged on the upper surface of the substrate K, it is hard to apply a bias potential uniformly in the vicinity of the portion covered by the extending portion 103 of the upper surface of the peripheral portion of the substrate K and therefore ions are not incident vertically on the substrate K and are apt to be incident obliquely thereon. Therefore, there is caused a problem that, as shown in FIG. 12, a side wall of a hole H or trench H which is formed by the etching is not perpendicular to the substrate K, for example, is inclined at a inclination angle α or β, and it is therefore not possible to obtain a highly accurate etching shape. It is noted that, in FIG. 12, a side wall when being inclined is indicated by the solid line and a side wall when being vertical is indicated by the two-dot chain line. Further, the reference M indicates a mask.

Therefore, it is necessary to arrange the jig for plasma etching 100 with high accuracy so that it is co-axial with the platen 105 and the substrate K. That is, as shown in FIGS. 8 to 11, in a case where, even if only a low accurate etching shape is obtained between the peripheral edge of the substrate K and a portion inward by a certain dimension d from the peripheral edge of the substrate K, a highly accurate etching shape is required in a region R (region of φD) located on the inner side of the portion inward by the certain dimension d, when the accuracy of arranging the jig 100 is low, the region R can overlap with a region S which is in the vicinity of the portion covered by the jig 100 (extending portion 103) and within which a highly accurate etching shape cannot be obtained, and it is therefore possible that only a low accurate etching shape is obtained also in the region R. Therefore, the jig 100 must be arranged with high accuracy so that it is co-axial with the platen 105 and the substrate K. It is noted that FIGS. 8 and 9 show a case where the accuracy of arranging the jig for plasma etching 100 is high and FIGS. 10 and 11 show a case where the accuracy of arranging the jig for plasma etching 100 is low.

Accordingly, the inventors have suggested a device as shown in FIGS. 13 and 14 as an etching device capable of improving accuracy of positioning a member for covering the upper surface of a peripheral portion of a substrate K. As shown in FIGS. 13 and 14, an etching device 100 is configured with a processing chamber 11 having a closed space, a substrate holding device 80 holding a silicon substrate K to be etched, a lifting cylinder 85 lifting up and down a platen 81 of the substrate holding device 80, a protective member 90 for covering the upper surface of a peripheral portion of the silicon substrate K held by the substrate holding device 80, a support body 91 supporting the protective member 90, an exhaust device 40 reducing the pressure within the processing chamber 11, a gas supply device 45 supplying a processing gas into the processing chamber 11, a plasma generating device 50 generating plasma from the processing gas supplied into the processing chamber 11, an RF power supply unit 55 supplying RF power to an electrode 82 of the substrate holding device 80, and other components.

The processing chamber 11 comprises a cylindrical lower container 12 and a cylindrical upper container 13 which each have an inner space communicating with that of the other, and the upper container 13 is formed to be smaller than the lower container 12 and is disposed on a central portion of the upper surface of the lower container 12. Further, two positioning pins 19 are vertically arranged on the bottom of the lower container 12.

The substrate holding device 80 has the platen 81 comprising the electrode 82 which has a disk shape, an insulator 83 which is formed on the electrode 82 and on which the silicon substrate K is placed, and a DC power supply unit 84 applying direct voltage to the electrode 82. The substrate holding device 80 generates a chucking force between the silicon substrate K and the insulator 83 by causing the DC power supply unit 84 to apply direct voltage to the electrode 82, thereby chucking and holding the silicon substrate K. The electrode 82 and the insulator 83 are formed to have an outer diameter larger than the outer diameter of the silicon substrate K so that their respective peripheral portions extend outward beyond the silicon substrate K placed on the insulator 83. It is noted that the platen 81 is arranged in the lower container 12.

The lifting cylinder 85 is connected to the lower surface of the electrode 82, and lifts up and down the platen 81 between a lifting-up end position and a lifting-down end position (waiting position).

The protective member 90 is formed in an annular and plate-like shape and is configured to be capable of being placed on a peripheral portion of the platen 81 (insulator 83). Further, the protective member 90 is configured to cover the upper surface of the peripheral portion of the silicon substrate K on the platen 81 with an inner peripheral edge portion thereof when being placed on the peripheral portion of the platen 81.

The support body 91 comprises an annular and plate-shaped lower member 92 which is arranged below the protective member 90 and is placed on the bottom of the lower container 12, and stick-shaped connecting members 94 connecting the upper surface of the lower member 92 and the lower surface of the protective member 90, and supports the protective member 90 between the lifting-up end position and the lifting-down end position. Further, the lower member 92 has two through holes 93 which are formed at positions spaced 180° from each other around the center of the lower member 92, the through holes 93 vertically passing through the lower member 92 and being engaged with the positioning pins 19.

The exhaust device 40 comprises an exhaust pump 41 and an exhaust pipe 42 connecting the exhaust pump 41 and a side wall of the lower container 12, and exhausts the gas within the lower container 12 through the exhaust pipe 42 to thereby reduce the pressure inside the processing chamber 11 to a predetermined pressure. The gas supply device 45 comprises a gas supply section 46 supplying a gas including an etching gas as the processing gas, and a supply pipe 47 connecting the gas supply section 46 and the upper surface of the upper container 13, and supplies the processing gas into the upper container 13 from the gas supply section 46 through the supply pipe 47.

The plasma generating device 50 comprises a plurality of annular coils 51 aligned vertically on the outer periphery of the upper container 13, and an RF power supply unit 52 supplying RF power to the coils 51, and generates plasma from the processing gas supplied into the upper container 13 by causing the RF power supply unit 52 to supply RF power to the coils 51. The RF power supply unit 55 produces a potential difference (bias potential) between the electrode 82 and the plasma within the processing chamber 11 by supplying RF power to the electrode 82.

According to the etching device 100 thus configured, the pressure inside the processing chamber 11 is reduced by the exhaust device 40 and a silicon substrate K is placed on the platen 81 which is at the lifting-down end position, and then direct voltage is applied to the electrode 82 by the DC power supply unit 84 and thereby the silicon substrate K is chucked and held. Thereafter, the platen 81 is lifted up from the lifting-down end position toward the lifting-up end position by the lifting cylinder 85. While the platen 81 is lifted up, the protective member 90 is placed onto the platen 81 and the upper surface of the peripheral portion of the silicon substrate K is covered by the inner peripheral edge portion of the protective member 90 and a structure comprising the protective member 90 and the support body 91 is lifted up together with the platen 81 (see FIG. 15).

Once the platen 81 is lifted up to the lifting-up end position, a processing gas is supplied into the processing chamber 11 by the gas supply device 45 and RF power is supplied to the coils 51 and to the electrode 82 by the RF power supply units 52 and 55, respectively. Plasma is generated from the supplied processing gas, and the silicon substrate K reacts with radicals generated by the generation of the plasma and ions generated by the generation of the plasma are made incident on the silicon substrate K by the bias potential, thereby etching the silicon substrate K. It is noted that, since the ion incidence is prevented by the protective member 90 on the upper surface of the peripheral portion of the silicon substrate K, the silicon substrate K are etched except the upper surface of the peripheral edge portion thereof.

Thereafter, once the etching is completed, the platen 81 is lifted down from the lifting-up end position toward the lifting-down end position by the lifting cylinder 85. While the platen 81 is lifted down, the lower member 92 is placed onto the bottom of the lower container 12 and the protective member 90 is separated from the platen 81 (see FIG. 13).

Thus, in this etching device 100, the engagement relationship between the through holes 93 of the lower member 92 and the positioning pins 19 on the bottom of the lower container 12 improves the accuracy of positioning the protective member 90 (structure comprising the protective member 90 and the support body 91). Thereby, deterioration of etching shape is prevented in a region located on the inner side of a portion inward by a certain dimension from the peripheral edge of the silicon substrate K.

CITATION LIST

Patent Literature

Patent document 1: Japanese Unexamined Patent Application Publication No. 2007-150036

SUMMARY OF THE DISCLOSURE

However, in the etching device 100, since the protective member 90 (structure comprising the protective member 90 and the support body 91) is positioned by the engagement relationship between the through holes 93 formed in the lower member 92 and the positioning pins 19 vertically arranged on the bottom of the lower container 12, the protective member 90 can be positioned only in an indirect manner at a position below and apart from the protective member 90 and therefore there is a certain limitation in the improvement in the accuracy of positioning the protective member 90. Further, only two pairs of the through hole 93 and the positioning pin 19 are used for positioning the protective member 90, which also causes a certain limitation in the improvement in the accuracy of positioning the protective member 90. Furthermore, there is also a problem that the positions of the positioning pins 19 are changed due to change of the temperature of the lower container 12 and the accuracy of positioning the protective member 90 is therefore reduced.

Because of this, a region on the inner side of a portion inward by a certain dimension from the peripheral edge of the silicon substrate K, in which a highly accurate etching shape is required, can overlap with the vicinity of the portion covered by the protective member 90 of the upper surface of the peripheral portion of the silicon substrate K, and in such a case, a side wall of a hole or trench formed by etching is not perpendicular to the silicon substrate K but is inclined with respect thereto due to ions incident obliquely on the silicon substrate K, and therefore only a low accurate etching shape is obtained also in the region.

The present invention has been achieved in view of the above-described circumstances and an object thereof is to provide an etching device and a plasma processing device capable of positioning a protective member for covering the upper surface of a peripheral portion of a substrate, with high accuracy.

The present invention, for achieving the above-described object, relates to an etching device comprising:

a processing chamber having a closed space;

a platen which is disposed in the processing chamber, on which a substrate is placed, and which is formed so that a peripheral portion thereof extends outward beyond the substrate placed;

chucking means chucking the substrate placed on the platen and fixing it;

gas supply means supplying a processing gas into the processing chamber;

plasma generating means generating plasma from the processing gas supplied into the processing chamber;

exhaust means exhausting a gas within the processing chamber to thereby reduce the pressure inside the processing chamber; and power supply means supplying RF power to the platen, the etching device characterized in that the etching device has:

a protective member which is formed in an annular and plate-like shape and is configured to be capable of being placed on the peripheral portion of the platen, and which, when placed on the peripheral portion of the platen, covers an upper surface of a peripheral edge portion of the substrate with an inner peripheral edge portion thereof in a state where a gap is formed between the protective member and the substrate on the platen without a contact portion between them;

support means disposed in the processing chamber for supporting the protective member; and lifting means which lifts up and down either one of the platen and the support means and which places the protective member supported by the support means onto the peripheral portion of the platen while lifting up and down it, the protective member has at least three first protrusions formed on a first pitch circle on a lower surface thereof, the first protrusions being engaged in point contact with the peripheral portion of the platen when the protective member is placed onto the platen, and the first pitch circle is set so that its center is co-axial with a central axis of the protective member.

According to the present invention, a substrate is placed on the platen and is chucked onto the platen and fixed thereon by the chucking means, and then either one of the platen and the support means is lifted up or down by the lifting means. While either one of the platen and the support means is lifted up or down, the protective member supported by the support means is placed onto the peripheral portion of the platen and the protective member is lifted up or down together with the platen. When the protective member is placed on the platen, the at least three first protrusions formed on the lower surface of the protective member are brought into engagement with the peripheral portion of the platen and thereby the protective member is positioned with respect to the platen. In this way, the upper surface of a peripheral edge portion of the substrate on the platen is covered by an inner peripheral edge portion of the protective member.

Thereafter, once the platen is lifted up or down to a predetermined position, a processing gas is supplied into the processing chamber by the gas supply means and plasma is generated from the supplied processing gas by the plasma generating means, and RF power is supplied to the platen by the power supply means and thereby a potential difference (bias potential) is produced between an electrode of the platen and the plasma generated from the processing gas. It is noted that the gas within the processing chamber has been exhausted by the exhaust means and the pressure inside the processing chamber has been reduced to a predetermined pressure.

Subsequently, a predetermined plasma processing is performed on the substrate on the platen by radicals in the plasma and by ions in the plasma which are made incident on the substrate by the bias potential. At this time, the ion incidence is prevented by the protective member on the upper surface of the peripheral edge portion of the substrate. Thereby, the substrate is plasma processed except the upper surface of the peripheral edge portion thereof.

Thereafter, once the plasma processing performed on the substrate is completed, either one of the platen and the support means is lifted up or down by the lifting means and the platen and the protective member are returned to their respective initial positions. Once the platen is returned to its initial position, the substrate on which the plasma processing has been performed is removed from the platen.

Thus, according to the etching device or the plasma processing device of the present invention, since the protective member is positioned with respect to the platen by engaging the at least three first protrusions formed on the lower surface of the protective member with the peripheral portion of the platen, the protective member can be directly positioned in the vicinity of the platen and can be positioned with high accuracy so that it is co-axial with the platen and the substrate. Further, the protective member can be positioned with higher accuracy by the positioning at three points than by the conventional positioning at two points.

Therefore, a region located on the inner side of a portion inward by a certain dimension from the peripheral edge of the substrate does not overlap with a region in the vicinity of the portion covered by the protective member in which a highly accurate etching shape cannot be obtained, and a highly accurate etching shape can be surely obtained in the region located on the inner side of the portion inward by the certain dimension from the peripheral edge of the substrate. Further, an effect that the yield is improved can be obtained.

Furthermore, since each of the first protrusions is brought into point contact with the peripheral portion of the platen, there is hardly a friction force which acts between them. Therefore, it is possible to effectively prevent the protective member from being placed obliquely in such a manner that it runs up on the substrate.

As described above, in this example, a gap is formed between the protective member and the substrate on the platen. The reason therefor is that, if, similarly to the above-described conventional jig for plasma etching, the jig is arranged so that its contact portion is brought into contact with the upper surface of the peripheral edge portion of the substrate, even when a resist film is not formed on the upper surface of the peripheral edge portion of the substrate, there is a possibility that the jig is heated by heat of the generated plasma and is thermally deformed and the deformed jig is brought into contact with the resist film, and if the jig is brought into contact with the resist film, the resist film is burned and damaged and the etching accuracy is therefore reduced. Therefore, forming a gap as this example can surely prevent the occurrence of such a problem.

It is noted that the plasma processing device may have a configuration in which:

the support means comprises a support member on which the protective member is placed and which supports the lower surface of the protective member;

the protective member has either one of at least three second protrusions, which are provided on a second pitch circle larger than the first pitch circle, and at least three long holes, which are configured to be capable of engaging with the second protrusions and are provided so that their longitudinal directions are oriented to the center of the second pitch circle, formed therein and the support member has the other of the second protrusions and the long holes formed therein;

the second pitch circle is set so that its center is co-axial with a central axis of the platen and the center of the first pitch circle; and the lifting means lifts up and down either one of the platen and the support member, and places the protective member placed on the support member onto the platen and places the protective member placed on the platen onto the support member while lifting up and down it.

Alternatively, the plasma processing device may have a configuration in which:

the support means comprises a lower member which is arranged below the protective member and is placed on the bottom of the processing chamber, and a connecting member connecting the lower member and the protective member;

the lower member has either one of at least three second protrusions, which are provided on a second pitch circle, and at least three long holes, which are configured to be capable of engaging with the second protrusions and are provided so that their longitudinal directions are oriented to the center of the second pitch circle, formed therein and the processing chamber has the other of the second protrusions and the long holes formed in the bottom thereof;

the second pitch circle is set so that its center is co-axial with a central axis of the platen and the center of the first pitch circle; and the lifting means lifts up and down the platen, and places a structure comprising the protective member, the connecting member and the lower member, which is placed on the bottom of the processing chamber, onto the platen and places the structure placed on the platen onto the bottom of the processing chamber while lifting up and down the platen.

In these cases, by the engagement relationship between the at least three long holes formed in one of the protective member and the support member and the at least three second protrusions formed on the other of the protective member and the support member, the protective member can be positioned with respect to the support member so that it is co-axial with the platen and the substrate. Alternatively, by the engagement relationship between the at least three long holes formed in one of the lower member and the bottom of the processing chamber and the at least three second protrusions formed on the other of the lower member and the bottom of the processing chamber, the lower member (structure comprising the protective member, the connecting member and the lower member) can be positioned with respect to the bottom of the processing chamber so that the protective member is co-axial with the platen and the substrate. Thus, positioning the protective member with respect to the support member and positioning the structure with respect to the bottom of the processing chamber make it possible to perform a more accurate positioning when placing the protective member on the platen. It is noted that said engagement relationship is an engagement relationship between long hole and protrusion, the accuracy of positioning the protective member is not reduced even if the positions of the second protrusions are changed due to change of the temperatures of the protective member, the support member, the lower member or the processing chamber.

Further, the processing device may have a configuration in which:

the platen has an electrode to which RF power is supplied by the power supply means, an insulator which is provided on the electrode and is formed to have an outer diameter smaller than the outer diameter of the electrode so that a peripheral portion of the electrode extends outward, and an annular member which is formed in an annular and plate-like shape and which is provided on the electrode so that only the insulator or only the insulator and the substrate are positioned within its annulus, and is configured so that the substrate is placed on the insulator;

the protective member is configured to be placed on the annular member by engagement between the first protrusions thereof and a peripheral portion of the annular member; and the protective member, the annular member and the insulator are each made of a material having a linear expansion coefficient of $3 \times 10^{-6}/°C$ to $8 \times 10^{-6}/°C$.

The insulator, the annular member and the protective member are heated by heat of the generated plasma, and the temperatures thereof are increased and they are thermally expanded. Therefore, if the insulator, the annular member and the protective member are made of a material having a large linear expansion coefficient or they are made of materials whose linear expansion coefficients are very different from one another, the clearance between the outer periphery of the insulator and the inner periphery of the annular member and the clearance between the outer periphery of the annular member and the first protrusions of the protective member are greatly changed depending on the temperatures of the insulator, the annular member and the protective member, and therefore it is necessary to set the clearances to be large.

Therefore, in a case where, as described above, the insulator, the annular member and the protective member are each made of a material having a small liner expansion coefficient of $3 \times 10\text{-}6/°C$ to $8 \times 10\text{-}6/°C$, the clearance between the outer periphery of the insulator and the inner periphery of the annular member and the clearance between the outer periphery of the annular member and the first protrusions of the protective member do not differ so much between at the time of high temperature and at the time of low temperature, and therefore it is possible to set the clearances to be small. This makes it possible to further improve the accuracy of positioning the protective member with respect to the platen. It is noted that the insulator, the annular member and the protective member are not necessarily made of the same material and may be made of different materials as long as the materials each have a linear expansion coefficient of $3 \times 10\text{-}6/°C$ to $8 \times 10\text{-}6/°C$.

As described above, according to the etching device and the plasma processing device of the present invention, the protective member can be positioned with respect to the platen so that its center highly accurately coincides with the center of the platen and the center of the substrate.

DETAILED DESCRIPTION

Figure 1:
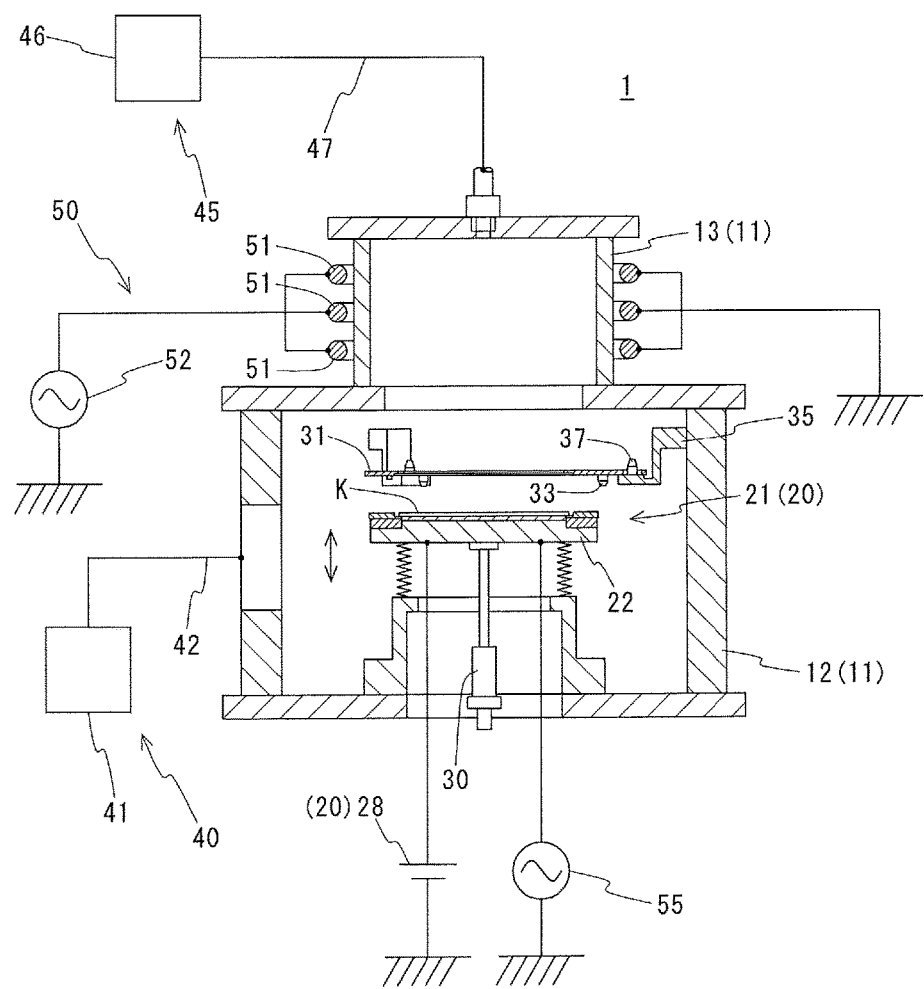
FIG. 1 is a sectional view showing a schematic configuration of an etching device according to one embodiment of the present invention.
Figure 2:
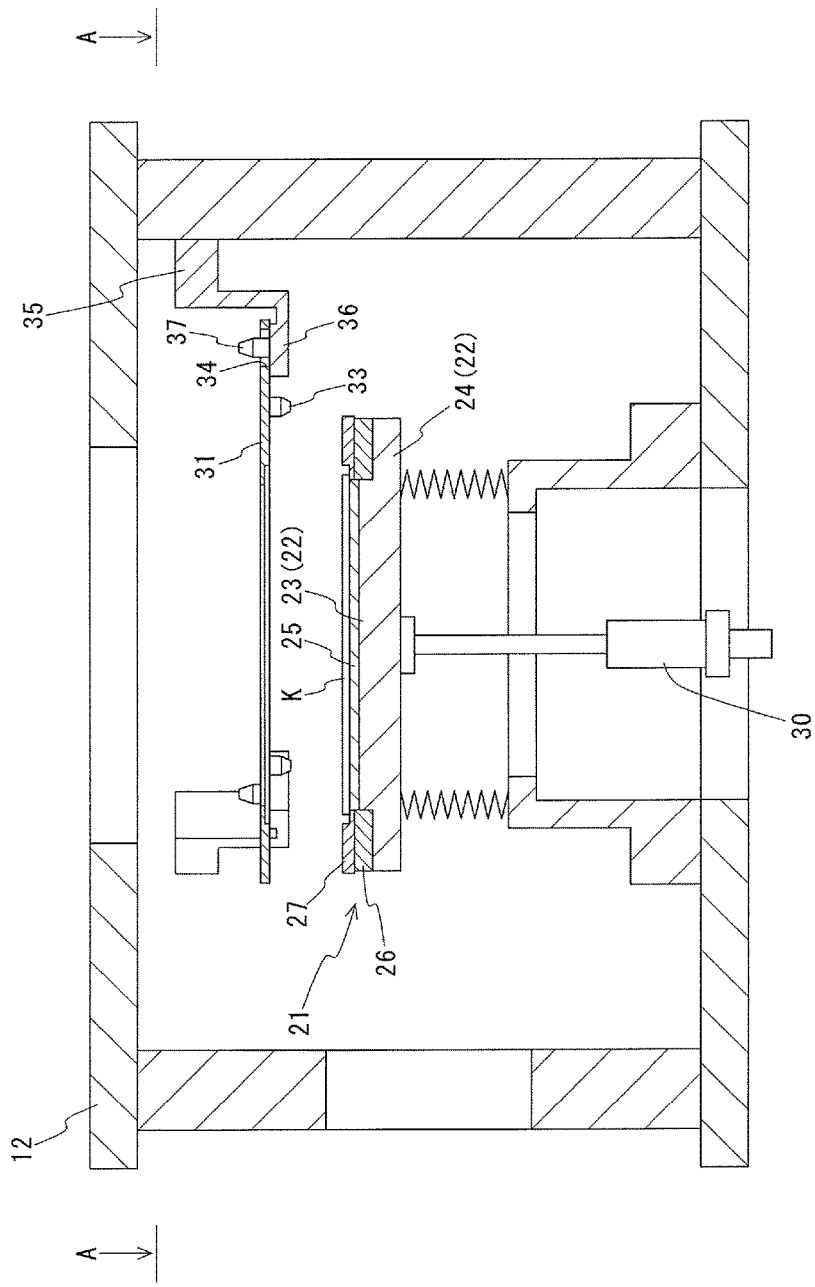
FIG. 2 is a sectional view showing a lower container, a substrate holding device, a lifting cylinder, a protective member and a support member according to the embodiment, and shows a case where a platen is at a lifting-down end position.
Figure 3:
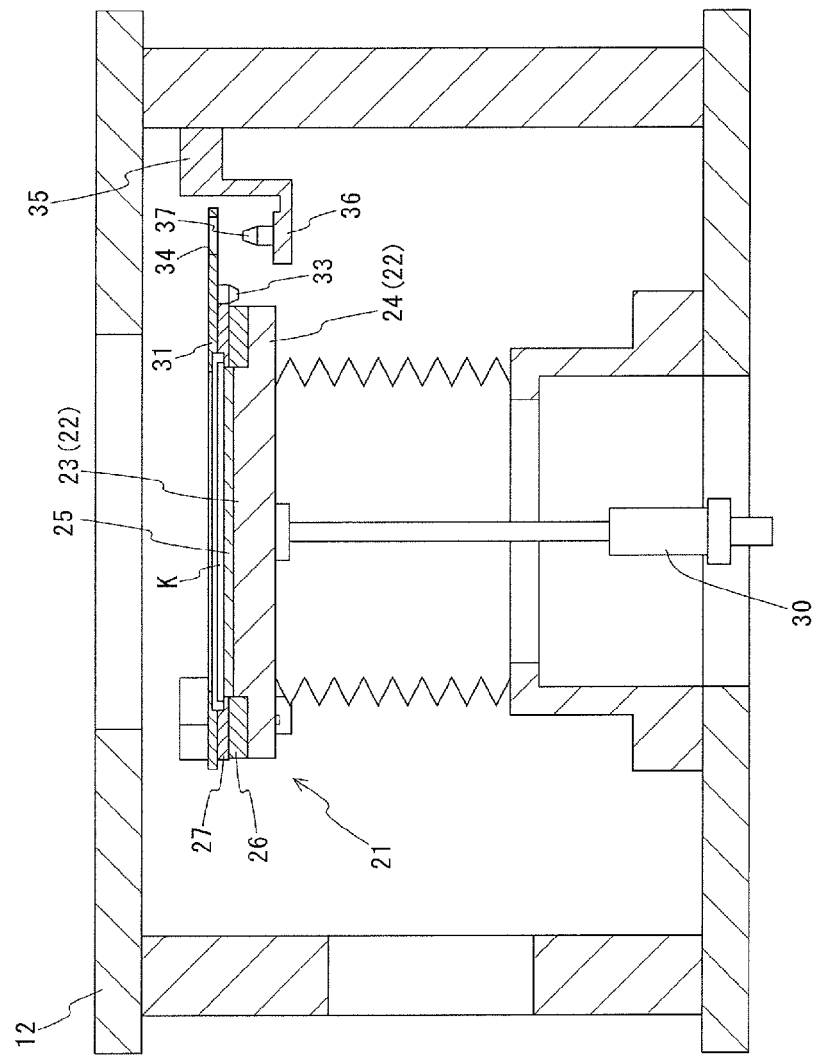
FIG. 3 is a sectional view showing the lower container, the substrate holding device, the lifting cylinder, the protective member and the support member according to the embodiment, and shows a case where the platen is at a lifting-up end position.
Figure 4:
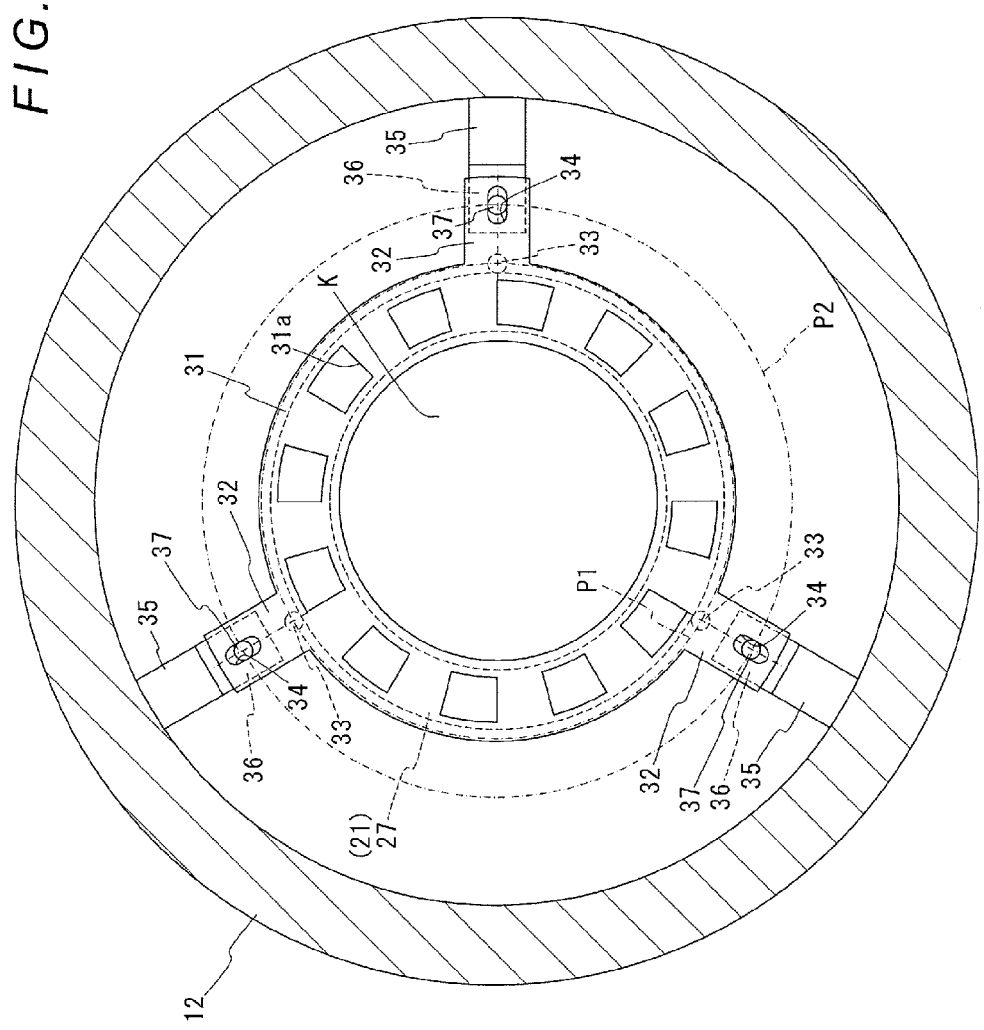
FIG. 4 is a sectional view taken along the arrow A-A in FIG. 2.

Hereinafter, a specific embodiment of the present invention will be described on the basis of the accompanying drawings. FIG. 1 is a sectional view showing a schematic configuration of an etching device according to one embodiment of the present invention, FIGS. 2 and 3 are sectional views showing a lower container, a substrate holding device, a lifting cylinder, a protective member and a support member according to the embodiment, FIG. 2 shows a case where a platen is positioned at a lifting-down end position and FIG. 3 shows a case where the platen is positioned at a lifting-up end position, and FIG. 4 is a sectional view taken along the arrow A-A in FIG. 2. Further, an etching device (plasma processing device) 1 of the embodiment is an improvement of the foregoing etching device 100, and therefore the same components as those of the etching device 100 are denoted by the same reference numerals and detailed explanations thereof are omitted.

As shown in FIGS. 1 to 4, the etching device 1 of the embodiment comprises the processing chamber 11, a substrate holding device 20 holding a silicon substrate K to be etched, a lifting cylinder 30 for lifting up and down a platen 21 of the substrate holding device 20, a protective member 31 for covering the upper surface of a peripheral edge portion of the silicon substrate K being held by the substrate holding device 20, three support members 35 supporting the protective member 31, the exhaust device 40, the gas supply device 45, the plasma generating device 50, the RF power supply unit 55 and other components. It is noted that the positioning pins 19 vertically arranged on the bottom of the lower chamber 12 are omitted. Further, the RF power supply unit 55 supplies RF power to an electrode 22 of the substrate holding device 20.

The substrate holding device 20 has the platen 21 which comprises: the electrode 22 formed in a disk shape and comprising a small-diameter portion 23 and a large-diameter portion 24 which is provided under the small-diameter portion 23 and a peripheral portion of which extends outward; an insulator 25 which is formed on the upper surface of the small-diameter portion 23 and on which the silicon substrate K is placed; a first annular member 26 which is provided on the upper surface of the peripheral portion of the large-diameter portion 24 and within the annulus of which the small-diameter portion 23 and a lower portion of the insulator 25 are arranged; and a second annular member 27 which is provided on the upper surface of the first annular member 26 and within the annulus of which an upper portion of the insulator 25 and the silicon substrate K are arranged, and a DC power supply unit 28 applying direct voltage to the electrode 22, and the platen 21 is arranged in the lower container 12. The electrode 22 and the first annular member 26 are made of aluminum, for example.

The second annular member 27 is formed so that its inner peripheral surface is spaced from the outer peripheral surface of the silicon substrate K and is formed to have an outer diameter larger than the outer diamenter of the first annular member 26 so that an outer peripheral portion thereof extends outward. Further, the second annular member 27 and the insulator 25 are made of the same material having a linear expansion coefficient of $3 \times 10$-$6/°$ C. to $8 \times 10$-$6/°$ C., and, as a material having such a linear expansion coefficient, ceramics of aluminum oxide, ceramics of yttrium oxide and ceramics of aluminum nitride can be given, for example. It is noted that the substrate holding device 20 generates a chucking force between the silicon substrate K and the insulator 25 by causing the DC power supply unit 28 to apply direct voltage to the electrode 22, thereby chucking and holding the silicon substrate K.

The lifting cylinder 30 is connected to the lower surface of the electrode 22 and lifts up and down the platen 21 between the lifting-up end position and the lifting-down end position (waiting position).

The protective member 31 is formed in an annular and plate-like shape and is configured to be capable of being placed on the upper surface of a peripheral portion (the second annular member 27) of the platen 21, and is configured to cover the upper surface of the peripheral edge portion of the silicon substrate K on the platen 21 (insulator 25) with an inner peripheral edge portion thereof when placed on the peripheral portion of the platen 21.

The protective member 31 has three protruding portions 32 which are extended in the radial direction from the peripheral edge thereof and supported by the support members 35 and which are provided at regular intervals in the circumferential direction. The protruding portions 32 have three first positioning pins (first protrusions) 33 formed on a first pitch circle P1 at root portions thereof and have three long holes 34 formed outside the positions at which the first positioning pins 33 are formed, the first positioning pins 33 tapering toward their respective lower ends, and the long holes 34 being formed to vertically pass through the protruding portions 32. The center of the first pitch circle P1 is co-axial with the central axis of the protective member 31. Further, the first positioning pins 33 are configured to be capable of engaging with an outer peripheral portion of the second annular member 27 when the protective member 31 is placed on the peripheral portion of the platen 21, and the long holes 34 are formed so that their longitudinal directions are oriented to the center of the protective member 31.

Further, the protective member 31 is formed so that a gap is formed between it and the upper surface of the peripheral edge portion of the silicon substrate K and between it and the outer peripheral surface of the silicon substrate K when the protective member 31 is placed on the peripheral portion of the platen 21. The protective member 31 is made of the same material as the second annular member 27 and the insulator 25, which has a linear expansion coefficient of $3 \times 10\text{-}6/^\circ$ C. to $8 \times 10\text{-}6/^\circ$ C., such as ceramics of aluminum oxide, ceramics of yttrium oxide and ceramics of aluminum nitride, for example. It is noted that it is preferable that the protective member 31 has through holes 31$a$ vertically passing therethrough for gas venting formed therein.

The support members 35 are fixedly provided on an inner wall of the lower container 12 and arranged corresponding to the protruding portions 32 of the protective member 31, and support the protective member 31 at a position which is located lower than the upper surface of the second annular member 27 when the platen 21 is at the lifting-up end position and which is located higher than the upper surface of the second annular member 27 when the platen 21 is at the lifting-down end position. The support members 35 have support portions 36 on which the protruding portions 32 are placed and which support the lower surfaces thereof, the support portions 36 have second positioning pins (second protrusions) 37 formed on a second pitch circle P2 larger than the first pitch circle P1, the second positioning pins 37 being capable of engaging with the long holes 34 and tapering toward their respective upper ends. The center of the second pitch circle P2 is co-axial with the central axis of the platen 21 (second annular member 27) and the center of the pitch circle P1.

According to the etching device 1 of the embodiment thus configured, initially, a silicon substrate K is loaded into the lower container 12 of the processing chamber 11 and is placed on the platen 21 which is at the lifting-down end position, and then direct voltage is applied to the electrode 22 by the DC power supply unit 28 and thereby the silicon substrate K is chucked and held. Thereafter, the platen 21 is lifted up by the lifting cylinder 30 from the lifting-down end position toward the lifting-up end position.

While the platen 21 is lifted up, the protective member 31 supported by the support members 35 (support portions 36) is placed onto the platen 21 (second annular member 27) and thereby the upper surface of the peripheral edge portion of the silicon substrate K is covered by the inner peripheral edge portion of the protective member 31 (see FIG. 3). When the protective member 31 is placed onto the platen 21, the three first positioning pins 33 formed on the lower surface of the protective member 31 are engaged with the peripheral portion of the platen 21, thereby positioning the protective member 31 with respect to the platen 21.

Thereafter, once the platen 21 is lifted up to the lifting-up end position together with the protective member 31, the silicon substrate K on the platen 21 is etched. Because ion incidence is prevented by the protective member 31 on the upper surface of the peripheral edge portion of the silicon substrate K, the silicon substrate K is etched except the upper surface of the peripheral edge portion.

Thereafter, once the etching is completed, the platen 21 is lifted down from the lifting-up end position toward the lifting-down end position by the lifting cylinder 30. While the platen 21 is lifted down, the protective member 31 placed on the platen 21 is placed onto the support members 35 (support portions 36) and therefore separated from the platen 21, and the platen 21 and the protective member 31 are returned to their respective initial positions (see FIG. 2). When the protective member 31 is placed onto the support members 35, the three second positioning pins 37 formed on the support portions 36 are engaged with the long holes 34 of the protective member 31, thereby positioning the protective member 31 with respect to the support members 35. Once the platen 21 is returned to its initial position, the etched silicon substrate K is removed from the platen 21 and loaded out of the lower container 12.

Thus, according to the etching device 1 of the embodiment, since, when the protective member 31 is placed onto the platen 21, the three first positioning pins 33 of the protective member 31 are engaged with the outer peripheral portion of the platen 21 to position the protective member 31 with respect to the platen 21, the protective member 31 can be directly positioned in the vicinity of the platen 21, and it is therefore possible to position the protective member 31 with high accuracy so that the protective member 31 is co-axial with the platen 21 and the silicon substrate K. Further, positioning the protective member 31 at three points also makes it possible to position the protective member 31 with higher accuracy as compared with the conventional positioning at two points.

Thereby, a region which is located on the inner side of a portion inward by a certain dimension from the peripheral edge of the silicon substrate K does not overlap with a region which is in the vicinity of the portion covered by the protective member 31 and in which a highly accurate etching shape cannot be obtained, and therefore a highly accurate etching shape can be surely obtained in a predetermined region of the upper surface of the silicon substrate K. Further, an effect that the yield is improved is also obtained.

Further, since the first positioning pins 33 are brought into point contact with the peripheral portion of the platen 21, there is hardly a friction force which acts between them and therefore it is possible to effectively prevent the protective member 31 from being placed obliquely in such manner that it runs up on the platen 21.

As described above, in the etching device 1 of the embodiment, a gap is formed between the protective member 31 and the silicon substrate K on the platen 21. The reason therefor is that, if, similarly to the conventional jig for plasma etching, the jig is arranged so that its contact portion is brought into contact with the upper surface of the peripheral edge portion of the substrate, even when a resist film is not formed on the upper surface of the peripheral edge portion of the substrate, there is a possibility that the jig is heated by heat of the generated plasma and thermally deformed and the thermally deformed jig is brought into contact with the resist film, and if the jig is brought into contact with the resist film, the resist film is burned and damaged and the etching accuracy is therefore reduced. Therefore, forming a gap like the etching device 1 of the embodiment makes it possible to surely prevent the occurrence of such a problem.

Further, since the three second positioning pins 37 of the support members 35 are engaged with the long holes 34 of the protective member 31 when the protective member 31 is placed onto the support members 35, it is possible to position the protective member 31 with respect to the support members 35 so that it is co-axial with the platen 21 and the silicon substrate K. Furthermore, even if the positions of the second positioning pins 37 are changed due to change of the temperature of the support members 35, the accuracy of positioning the protective member 31 is not reduced. Positioning the protective member 31 with respect to the support members 35 in this way makes it possible to more accurately position the protective member 31 when placing the protective member 31 onto the platen 21.

The electrode 22, the insulator 25, the first annular member 26, the second annular member 27 and the protective member 31 are heated by the heat of the generated plasma and the temperatures thereof are increased, and thereby they are thermally expanded. Therefore, if the first annular member 26 is omitted and the second annular member 27 is provided directly on the upper surface of the peripheral portion of the large-diameter portion 24, it is necessary to set the clearance between the outer periphery of the small-diameter portion 23 and the inner periphery of the second annular member 27 to be large because the quantity of the thermal expansion of the small-diameter portion 23 is very different from that of the second annular member 27. Further, if the insulator 25, the second annular member 27 and the protective member 31 are made of a material having a large linear expansion coefficient or they are made of materials whose linear expansion coefficients are very different from one another, it is necessary to set the clearance between the outer periphery of the insulator 25 and the inner periphery of the second annular member 27 and the clearance between the outer periphery of the second annular member 27 and the first positioning pins 33 of the protective member 31 to be large because the clearances are greatly changed depending on the temperatures of the insulator 25, the second annular member 27 and the protective member 31.

Therefore, in the embodiment, as described above, providing the second annular member 27 on the upper surface of the peripheral portion of the large-diameter portion 24 through the first annular member 26 allows the small-diameter portion 23 not to be arranged within the annulus of the second annular member 27, that is, allows only the silicon substrate K and the insulator 25 to be arranged there, and further, the insulator 25, the second annular member 27 and the protective member 31 are made of the same material having a small linear expansion coefficient. Therefore, it is not necessary to take into consideration the difference of linear expansion coefficient between the second annular member 27 and the electrode 22. Further, since the clearance between the outer periphery of the insulator 25 and the inner periphery of the second annular member 27 and the clearance between the other periphery of the second annular member 27 and the first positioning pins 33 of the protective member 31 do not differ so much between at the time of high temperature and at the time of low temperature, it is possible to set the clearances to be small. Thereby, it is possible to further improve the accuracy of positioning the protective member 31 with respect to the platen 21.

Besides, there is an effect that the etching device 1 can be made by improving the etching device 100.

Thus, one embodiment of the present invention has been described. However, a specific embodiment in which the present invention can be implemented is not limited thereto.

Figure 5:
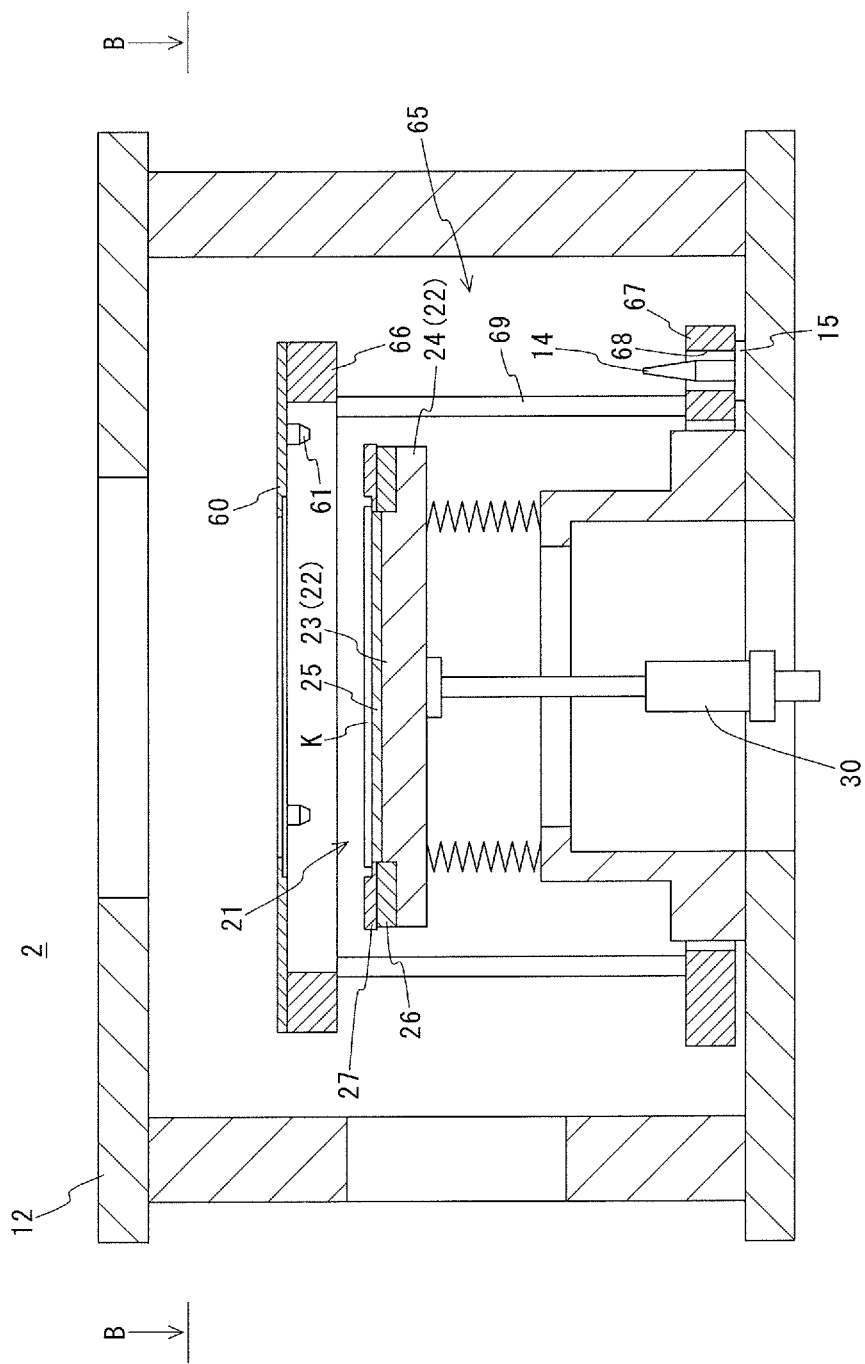
FIG. 5 is a sectional view showing a lower container, a substrate holding device, a lifting cylinder, a protective member and a support body according to an alternative embodiment of the present invention, and shows a case where a platen is at a lifting-down end position.
Figure 6:
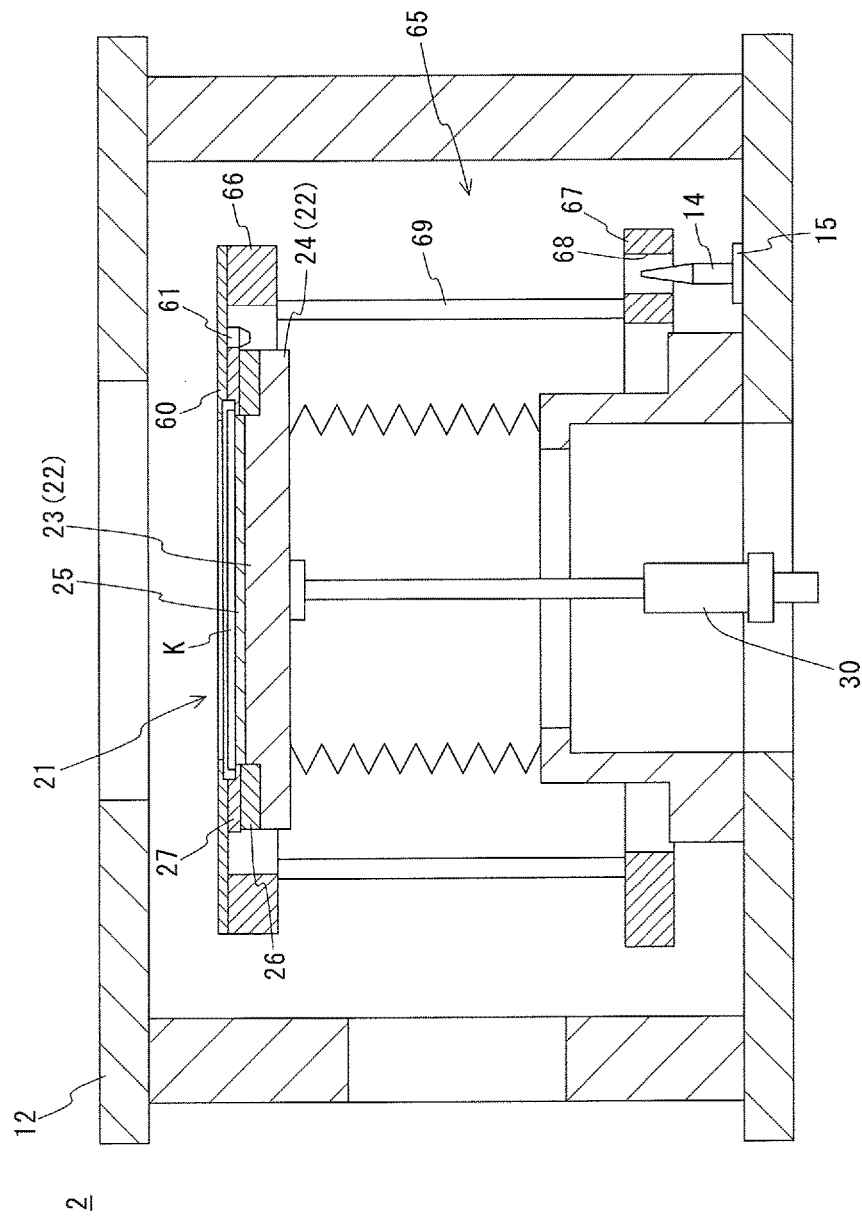
FIG. 6 is a sectional view showing the lower container, the substrate holding device, the lifting cylinder, the protective member and the support body according to the alternative embodiment of the present invention, and shows a case where the platen is at a lifting-up end position.
Figure 7:
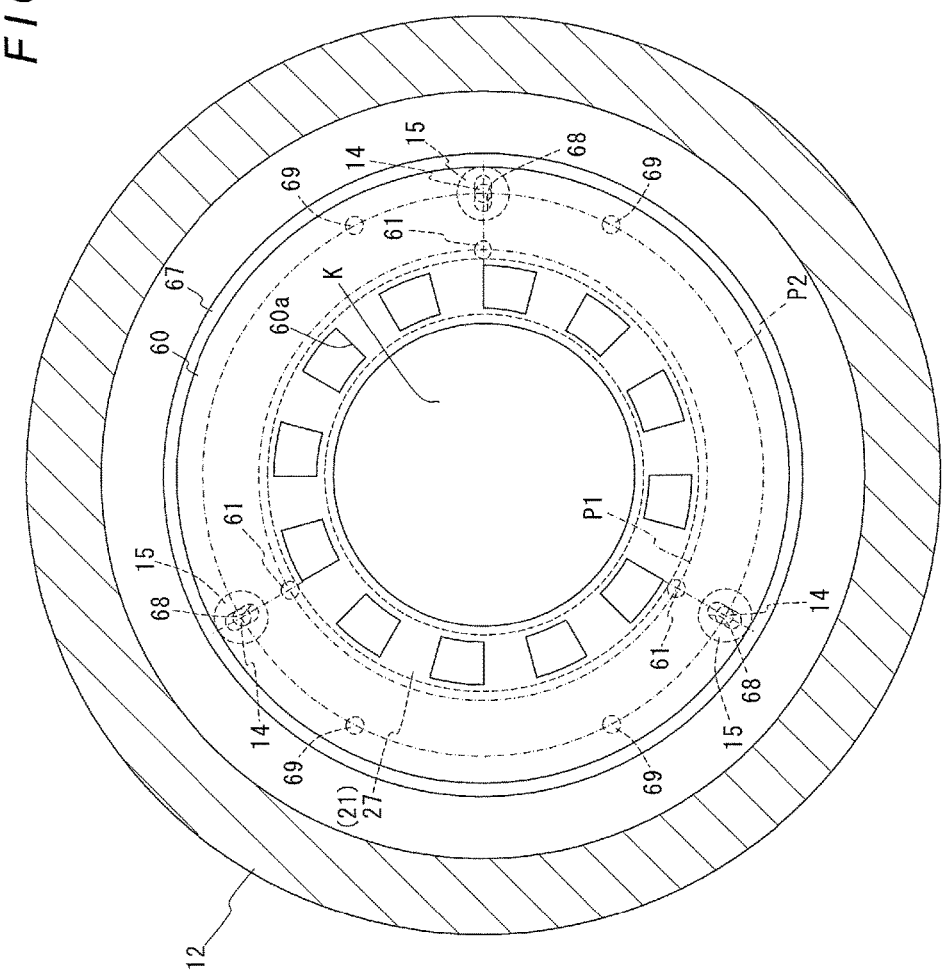
FIG. 7 is a sectional view taken along the arrow B-B in FIG. 5.
Figure 8:
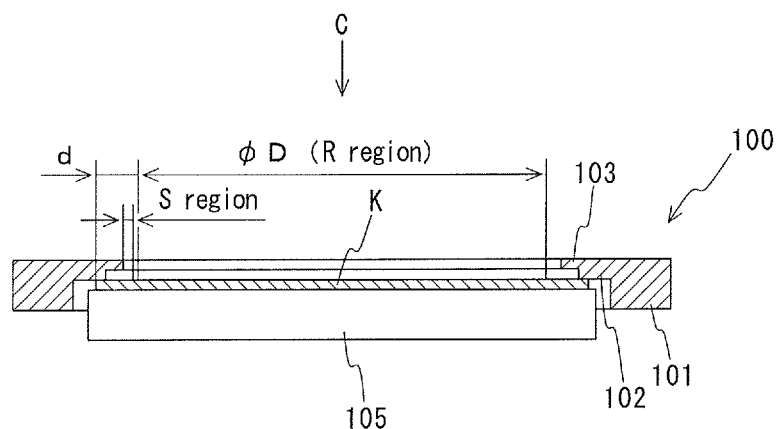
FIG. 8 is a sectional view showing a schematic configuration of a jig for plasma etching and other components, and shows a case where the accuracy of arranging the jig is high.
Figure 9:
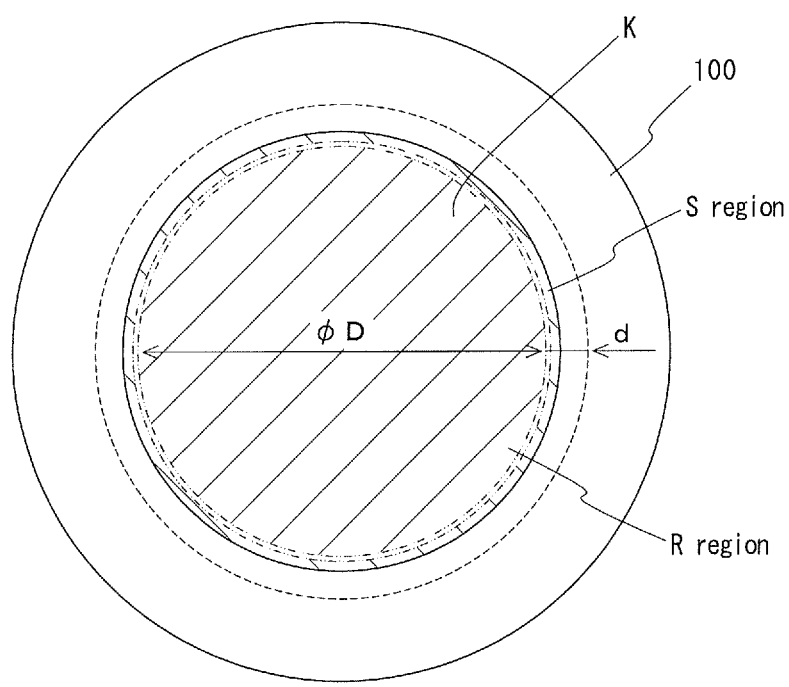
FIG. 9 is a plan view seen in the direction of the arrow C in FIG. 8.
Figure 10:
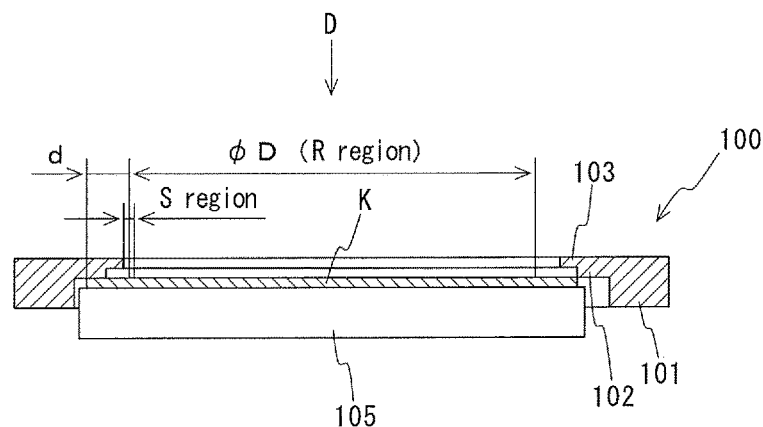
FIG. 10 is a sectional view showing a schematic configuration of the jig for plasma etching and other components, and shows a case where the accuracy of arranging the jig is low.
Figure 11:
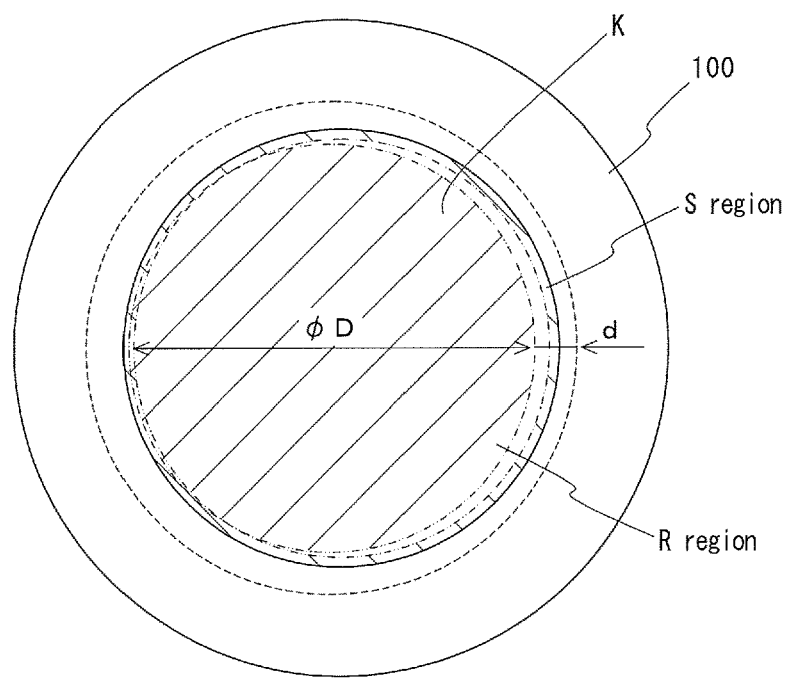
FIG. 11 is a plan view seen in the direction of the arrow D in FIG. 10.
Figure 12:
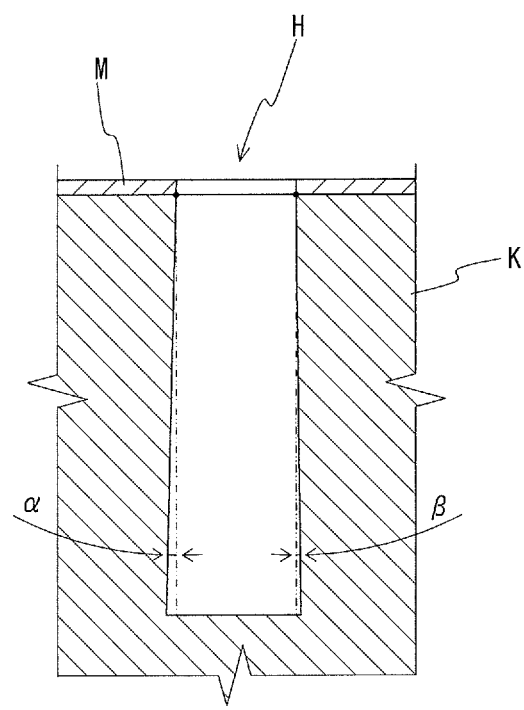
FIG. 12 is a sectional view for explaining a conventional problem.
Figure 13:
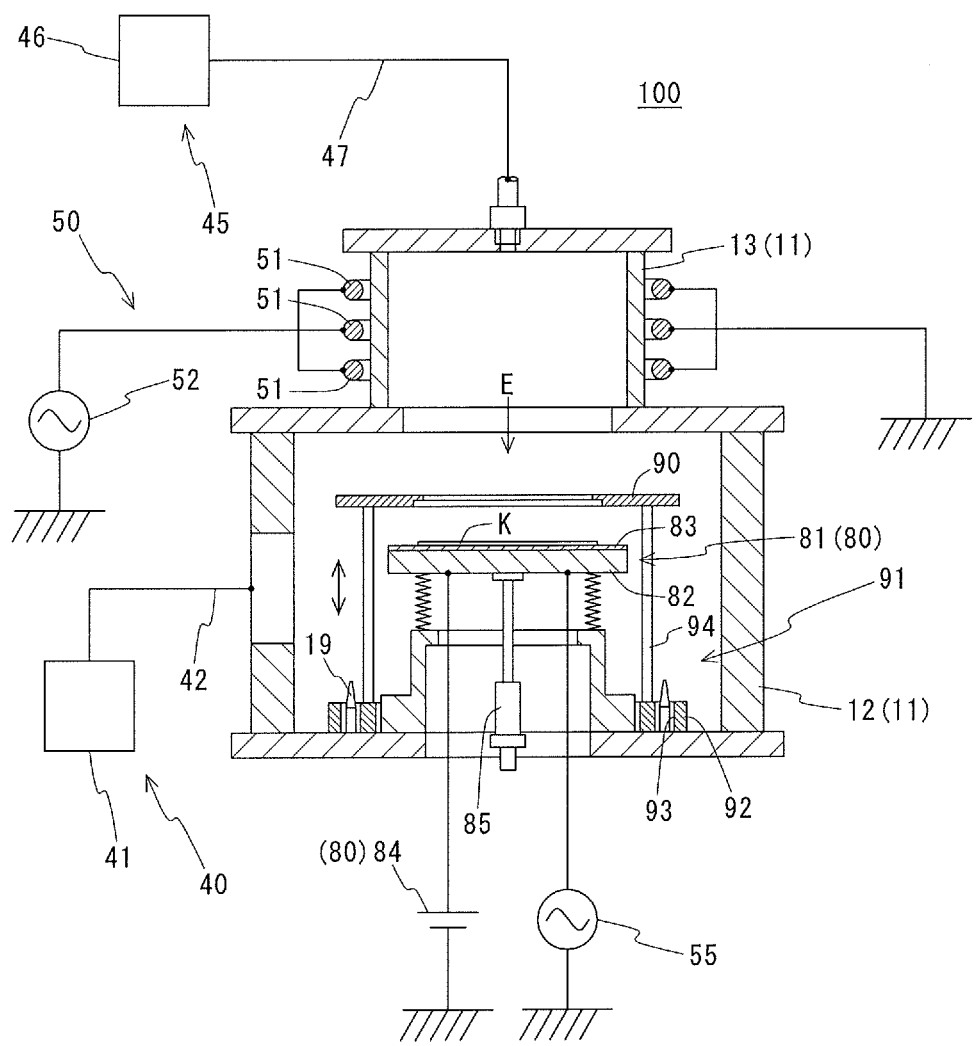
FIG. 13 is a sectional view showing a schematic configuration of a conventional etching device.
Figure 14:
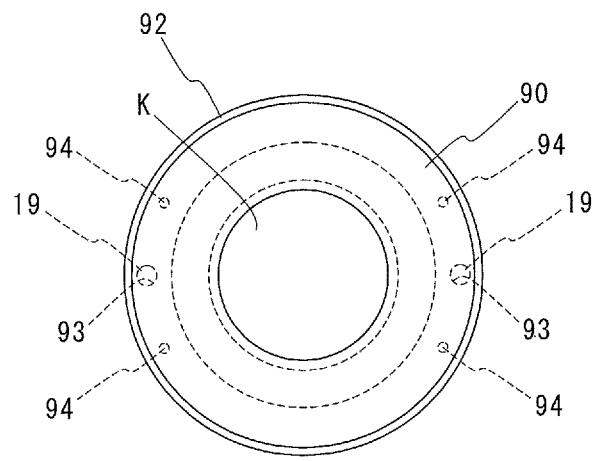
FIG. 14 is a plan view seen in the direction of the arrow E in FIG. 13.
Figure 15:
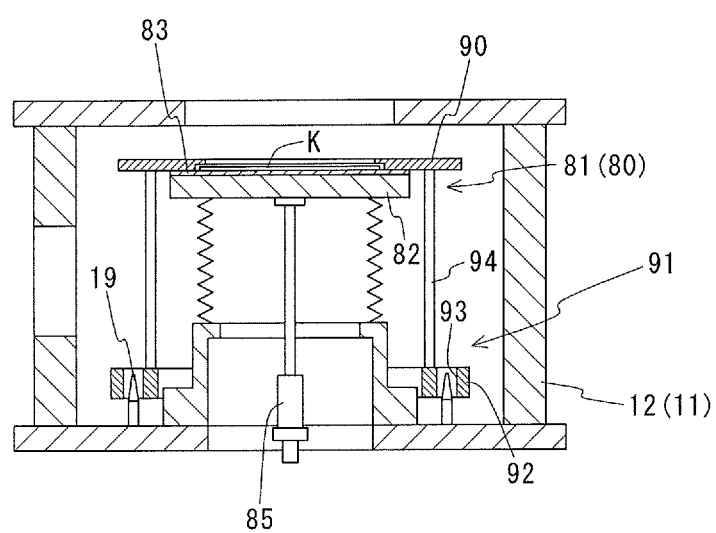
FIG. 15 is a sectional view showing conventional lower container, substrate holding device, lifting cylinder, protective member and support body, and shows a case where a platen is at a lifting-up end position.

For example, an etching device 2 may be employed in which a protective member 60 and a support body 65 as shown in FIGS. 5 to 7 are provided instead of the protective member 31 and the support members 35. It is noted that, in the explanation below, the same components as those of the etching device 1 are denoted by the same reference numerals and detailed explanations thereof are omitted. Further, FIGS. 5 and 6 are sectional views showing a lower container, a substrate holding device, a lifting cylinder, a protective member and a support body according to an alternative embodiment of the present invention, and FIG. 7 is a sectional view taken along the arrow B-B in FIG. 5.

As shown in FIGS. 5 to 7, the etching device 2 is configured with the processing chamber 11, the substrate holding device 20, the lifting cylinder 30, the protective member 60 for covering the upper surface of a peripheral edge portion of the silicon substrate K held by the substrate holding device 20, the support body 65 supporting the protective member 60, the exhaust device 40, the gas supply device 45, the plasma generating device 50, the RF power supply unit 55 and other components.

The protective member 60 is, similarly to the protective member 31, formed in an annular and plate-like shape and configured to be capable of being placed on the upper surface of a peripheral portion of the platen 21 (the second annular member 27), and is configured to cover the upper surface of the peripheral edge portion of the silicon substrate K on the platen 21 with an inner peripheral edge portion thereof when placed on the peripheral portion of the platen 21.

On the lower surface of the protective member 60, three first positioning pins (first protrusions) 61 which are formed to taper toward their respective lower ends and which can be engaged with an outer peripheral portion of the second annular member 27 when the protective member 60 is placed onto the peripheral portion of the platen 21 are formed on a first pitch circle P1 at regular intervals in the circumferential direction. The center of the first pitch circle P1 is co-axial with the central axis of the protective member 60. Further, the protective member 60 is formed so that a gap is formed between it and the upper surface of the peripheral edge portion of the silicon substrate K and between it and the outer peripheral surface of the silicon substrate K when the protective member 60 is placed on the peripheral portion of the platen 21. The protective member 60 is made of the same material as the second annular member 27 and the insulator 25. It is noted that it is preferable that the protective member 60 has through holes 60a vertically passing therethrough for gas venting formed therein.

The support body 65 comprises an annular and plate-shaped upper member 66 which is provided on a periphery-side lower surface of the protective member 60 so that the first positioning pins 61 are arranged in its annulus and the support body 65 is co-axial with the protective member 60, an annular and plate-shaped lower member 67 which is arranged below the upper member 66 and which is placed on the bottom of the lower container 12, and stick-shaped connecting members 69 which connects the lower surface of the upper member 66 and the upper surface of the lower member 67 so that the upper member 66 and the lower member 67 are co-axial with each other, and supports the protective member 60 at a position which is located lower than the upper surface of the second annular member 27 when the platen 21 is at the lifting-up end position and which is located higher than the upper surface of the second annular member 27 when the platen 21 is at the lifting-down end position. The lower member 67 has three long holes 68 formed therein at regular intervals in the circumferential direction so that they vertically pass therethrough and their longitudinal directions are oriented to the center of the lower member 67.

On the bottom of the lower container 12, three second positioning pins (second protrusions) 14 which are capable of engaging with the long holes 68 are vertically arranged at regular intervals in the circumferential direction on a second pitch circle P2 larger than the first pitch circle P1, and the center of the second pitch circle P2 is co-axial with the central axis of the platen 21 (second annular member 27) and the center of the first pitch circle P1. Each of the second positioning pins 14 is formed to taper toward its upper end and has a flange portion 15 formed at a root portion thereof.

In the etching device 2 thus configured, once a silicon substrate K is placed on the platen 21 positioned at the lifting-down end position and is chucked and held, the platen 21 is lifted up toward the lifting-up end position. While the platen 21 is lifted up, the protective member 60 supported by the support body 65 is placed onto the platen 21 (second annular member 27) and thereby the upper surface of the peripheral edge portion of the silicon substrate K is covered by the inner peripheral edge portion of the protective member 60 (see FIG. 6). When the protective member 60 is placed onto the platen 21, the three first positioning pins 61 formed on the lower surface of the protective member 60 are engaged with the peripheral portion of the platen 21, thereby positioning the protective member 60 with respect to the platen 21.

Thereafter, once the platen 21 is lifted up to the lifting-up end position together with the protective member 60 and the support body 65, the silicon substrate K on the platen 21 is etched. However, since ion incidence is prevented by the protective member 60 on the upper surface of the peripheral edge portion of the silicon substrate K, the silicon substrate K is etched except the upper surface of the peripheral edge portion.

Thereafter, once the etching is completed, the platen 21 is lifted down toward the lifting-down end position. While the platen 21 is lifted down, the structure comprising the protective member 60 and the support body 65, which is placed on the platen 21, is placed onto the bottom of the lower container 12 (the flange portion 15) and the protective member 60 is separated from the platen 21, and the platen 21, the protective member 60 and the support body 65 are returned to their respective initial positions (see FIG. 5). When the structure is placed onto the bottom of the lower container 12, the second positioning pins 14 vertically arranged on the bottom of the lower container 12 are engaged with the long holes 68 of the lower member 67, thereby positioning the lower member 67 (the structure) with respect to the bottom of the lower container 12. Once the platen 21 is returned to its initial position, the etched silicon substrate K is removed from the platen 21.

Thus, according to the etching device 2 also, similarly to the etching device 1, when the protective member 60 is placed onto the platen 21, engaging the three first positioning pins 61 of the protective member 60 with the peripheral portion of the platen 21 makes it possible to directly position the protective member 60 in the vicinity of the platen 21, and therefore the same effects as those described above can be obtained, for example, it is possible to position the protective member 60 with high accuracy so that it is co-axial with the platen 21 and the silicon substrate K.

Further, when placing the structure (lower member 67) onto the bottom of the lower container 12, the structure can be positioned with respect to the bottom of the lower container 12 so that it is co-axial with the platen 21 and the silicon substrate K since the three second positioning pins 14 on the bottom of the lower container 12 are engaged with the long holes 68 of the lower member 67. Furthermore, even if the positions of the second positioning pins 14 are changed by change of the temperature of the lower container 12, the accuracy of positioning the structure is not reduced. Positioning the structure with respect to the bottom of the lower container 12 in this way allows the protective member 60 to be positioned more accurately when placing the protective member 60 onto the platen 21.

Although the etching device 1 has the configuration in which the long holes 34 are formed in the protective member 31 and the second positioning pins 37 are formed on the support members 35, a configuration is possible in which second positioning pins are formed on the protective member 31 and long holes are formed in the support members 35. Similarly, the etching device 2 may have a configuration in which positioning pins are formed on the lower member 67 and long holes are formed in the bottom of the lower container 12.

Further, although, in the above embodiments, etching processing is given as an example of plasma processing, it is not limited thereto and the present invention can be applied to ashing processing, deposition processing or the like. Furthermore, the substrate K to be processed is not limited to a silicon substrate and may be any substrate such as a glass substrate.

What is claimed is:

1. An etching device comprising:
    a processing chamber having a closed space;
    a platen which is disposed in the processing chamber, on which a substrate is placed, and which is formed so that a peripheral portion thereof extends outward beyond the substrate placed;
    chucking means chucking the substrate placed on the platen and fixing it;
    gas supply means supplying a processing gas into the processing chamber;
    plasma generating means generating plasma from the processing gas supplied into the processing chamber;
    exhaust means exhausting a gas within the processing chamber to thereby reduce the pressure inside the processing chamber; and
    power supply means supplying RF power to the platen,
    the etching device having:
        a protective member which is formed in an annular and plate-like shape and is configured to be capable of being placed on the peripheral portion of the platen, and which, when placed on the peripheral portion of the platen, covers an upper surface of a peripheral edge portion of the substrate with an inner peripheral edge portion thereof in a state where a gap is formed between the protective member and the substrate on the platen without a contact portion between them;
        support means disposed in the processing chamber for supporting the protective member; and
        a lift which lifts up and down either one of the platen and the support means and which places the protective member supported by the support means onto the peripheral portion of the platen while lifting up and down it,
    the protective member having at least three first positioning pins formed on a first pitch circle on a lower surface thereof, the first positioning pins being engaged in tangential contact with a peripheral surface of the platen when the protective member is placed onto the platen, the first pitch circle being set so that its center is co-axial with a central axis of the protective member, the support means comprising a support member on which the protective member is placed and which supports the lower surface of the protective member;

the protective member having either at least three second positioning pins or at least three long holes formed therein and the support member having the other of the second positioning pins and the long holes formed therein, the at least three second positioning pins being provided on a second pitch circle larger than the first pitch circle, the at least three long holes being configured to engage with the second positioning pins and having longitudinal directions oriented to the center of the second pitch circle;

the second pitch circle having a center that is co-axial with a central axis of the platen and the center of the first pitch circle;

when the protective member is placed onto the platen by the lift, the first positioning pins being engaged with the peripheral surface of the platen, thereby positioning the protective member; and when the protective member is placed onto the support member by the lift, the first positioning pins being disengaged from the peripheral surface of the platen, and the second positioning pins being engaged with the long holes, thereby positioning the protective member.

2. An etching device according to claim 1, wherein the lift is configured to lift up and down either one of the platen and the support member, and place the protective member placed on the support member onto the platen while lifting up the platen or lifting down the support member and place the protective member placed on the platen onto the support member while lifting down the platen or lifting up the support member.

3. An etching device according to claim 1, wherein:

the platen has an electrode to which RF power is supplied by the power supply means, an insulator which is provided on the electrode and is formed to have an outer diameter smaller than the outer diameter of the electrode so that a peripheral portion of the electrode extends outward, and an annular member which is formed in an annular and plate-like shape and which is provided on the electrode so that only the insulator or only the insulator and the substrate are positioned within its annulus;

the platen is configured so that the substrate is placed on the insulator;

the protective member is configured to be placed on the annular member by engagement between the first positioning pins thereof and an outer peripheral portion of the annular member; and the protective member, the annular member and the insulator are made of a same material having a linear expansion coefficient of $3 \times 10^{-6}/°$ C. to $8 \times 10^{-6}/°$ C.

4. An etching device according to claim 1, in which the protective member has exactly three first positioning pins.

5. An etching device according to claim 1, in which each of the first positioning pins is radially aligned with a selected one of the second positioning pins.

6. A plasma processing device comprising:

a processing chamber having a closed space;

a platen which is disposed in the processing chamber, on which a substrate is placed, and which is formed so that a peripheral portion thereof extends outward beyond the substrate placed;

chucking means chucking the substrate placed on the platen and fixing it;

gas supply means supplying a processing gas into the processing chamber;

plasma generating means generating plasma from the processing gas supplied into the processing chamber;

exhaust means exhausting a gas within the processing chamber to thereby reduce the pressure inside the processing chamber; and power supply means supplying RF power to the platen, the plasma processing device having:

a protective member which is formed in an annular and plate-like shape and is configured to be capable of being placed on the peripheral portion of the platen, and which, when placed on the peripheral portion of the platen, covers an upper surface of a peripheral edge portion of the substrate with an inner peripheral edge portion thereof in a state where a gap is formed between the protective member and the substrate on the platen;

support means disposed in the processing chamber for supporting the protective member; and a lift which lifts up and down either one of the platen and the support means and which places the protective member supported by the support means onto the peripheral portion of the platen while lifting up and down it, the protective member having at least three first positioning pins formed on a first pitch circle on a lower surface thereof, the first positioning pins being engaged in tangential contact with a peripheral surface of the platen when the protective member is placed onto the platen, the first pitch circle being set so that its center is co-axial with a central axis of the protective member, the support means comprising a lower member which is arranged below the protective member and is placed on the bottom of the processing chamber, and a connecting member connecting the lower member and the protective member, the lower member having either at least three second positioning pins or at least three long holes formed therein and the processing chamber having the other of the at least three second positioning pins and the at least three long holes formed in the bottom thereof, the at least three second positioning pins being provided on a second pitch circle, the at least three long holes being configured to be capable of engaging with the second positioning pins and being provided so that their longitudinal directions are oriented to the center of the second pitch circle, the second pitch circle being set so that its center is co-axial with a central axis of the platen and the center of the first pitch circle, when the protective member is placed onto the platen by the lift, the first positioning pins being engaged with the peripheral surface of the platen, thereby positioning the protective member, and when the lower member is placed onto the bottom of the processing chamber by the lift, the first positioning pins being disengaged from the peripheral surface of the platen, and the second positioning pins being engaged with the long holes, thereby positioning the protective member.

7. A plasma processing device according to claim 6, wherein:
the platen has an electrode to which RF power is supplied by the power supply means, an insulator which is provided on the electrode and is formed to have an outer diameter smaller than the outer diameter of the electrode so that a peripheral portion of the electrode extends outward, and an annular member which is formed in an annular and plate-like shape and which is provided on the electrode so that only the insulator or only the insulator and the substrate are positioned within its annulus; and
the platen is configured so that the substrate is placed on the insulator.

8. A plasma processing device according to claim 7, wherein:
the protective member is configured to be placed on the annular member by engagement between the first positioning pins thereof and an outer peripheral portion of the annular member; and
the protective member, the annular member and the insulator are each made of a material having a linear expansion coefficient of $3\times10^{-6}/°$ C. to $8\times10^{-6}/°$ C.

9. A plasma processing device according to claim 8, wherein the protective member, the annular member and the insulator are made of a same material.

10. A plasma processing device according to claim 6, wherein the lift is configured to lift up and down the platen, and place a structure comprising the protective member, the connecting member and the lower member, which is placed on the bottom of the processing chamber, onto the platen while lifting up the platen and place the structure placed on the platen onto the bottom of the processing chamber while lifting down the platen.

11. An etching device comprising:
a processing chamber having a closed space;
a platen which is disposed in the processing chamber, on which a substrate is placed, and which is formed so that a peripheral portion thereof extends outward beyond the substrate placed;
chucking means chucking the substrate placed on the platen and fixing it;
gas supply means supplying a processing gas into the processing chamber;
plasma generating means generating plasma from the processing gas supplied into the processing chamber;
exhaust means exhausting a gas within the processing chamber to thereby reduce the pressure inside the processing chamber; and
power supply means supplying RF power to the platen, the etching device having:
a protective member which is formed in an annular and plate-like shape and is configured to be capable of being placed on the peripheral portion of the platen, and which, when placed on the peripheral portion of the platen, covers an upper surface of a peripheral edge portion of the substrate with an inner peripheral edge portion thereof in a state where a gap is formed between the protective member and the substrate on the platen without a contact portion between them;
support means disposed in the processing chamber for supporting the protective member; and
a lift which lifts up and down either one of the platen and the support means and which places the protective member supported by the support means onto the peripheral portion of the platen while lifting up and down it,
the protective member having at least three first protrusions formed on a first pitch circle on a lower surface thereof, the first protrusions being engaged in tangential contact with an outermost circumference of the platen when the protective member is placed onto the platen,
the first pitch circle being set so that its center is co-axial with a central axis of the protective member,
the support means comprising a support member on which the protective member is placed and which supports the lower surface of the protective member;
the protective member having either at least three second protrusions or at least three long holes formed therein and the support member having the other of the second protrusions and the long holes formed therein, the at least three second protrusions being provided on a second pitch circle larger than the first pitch circle, the at least three long holes being configured to engage with the second protrusions and having longitudinal directions oriented to the center of the second pitch circle; and
the second pitch circle having a center that is co-axial with a central axis of the platen and the center of the first pitch circle.

* * * * *